US008427838B2

(12) United States Patent
Hsieh et al.

(10) Patent No.: US 8,427,838 B2
(45) Date of Patent: Apr. 23, 2013

(54) ELECTRONIC DEVICE WITH KEY MECHANISM THEREOF

(75) Inventors: Kun-Chih Hsieh, Taipei Hsien (TW); Jian-Qiang Zhao, Shenzhen (CN); Jin-Sheng Huang, Shenzhen (CN)

(73) Assignees: Hong Fu Jin Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 213 days.

(21) Appl. No.: 12/953,485

(22) Filed: Nov. 24, 2010

(65) Prior Publication Data

US 2011/0267788 A1 Nov. 3, 2011

(30) Foreign Application Priority Data

Apr. 29, 2010 (CN) .......................... 2010 1 0159936

(51) Int. Cl.
*H05K 5/00* (2006.01)

(52) U.S. Cl.
USPC ............................ 361/759; 361/807; 361/809

(58) Field of Classification Search .......... 361/728–730, 361/807, 810, 752, 759
See application file for complete search history.

(56) References Cited

U.S. PATENT DOCUMENTS

| | | | | |
|---|---|---|---|---|
| 5,943,214 | A * | 8/1999 | Sato et al. | 361/752 |
| 7,038,921 | B2 * | 5/2006 | Mitani | 361/809 |
| 8,174,846 | B2 * | 5/2012 | Hamada et al. | 361/810 |
| 2007/0017791 | A1 | 1/2007 | Peng et al. | |
| 2008/0130208 | A1 * | 6/2008 | Watanabe et al. | 361/680 |
| 2009/0152087 | A1 | 6/2009 | Wang | |
| 2009/0205942 | A1 * | 8/2009 | Sakai et al. | 200/341 |
| 2010/0188327 | A1 * | 7/2010 | Frid et al. | 345/156 |
| 2012/0047455 | A1 * | 2/2012 | Yuan et al. | 715/781 |

FOREIGN PATENT DOCUMENTS

| | | | |
|---|---|---|---|
| CN | 2622831 | Y | 6/2004 |
| CN | 2821831 | Y | 9/2006 |
| CN | 201044466 | Y | 4/2008 |
| JP | 2009-288321 | * | 12/2009 |
| TW | 200929294 | A | 7/2009 |

* cited by examiner

*Primary Examiner* — Hung S Bui
(74) *Attorney, Agent, or Firm* — Altis Law Group, Inc.

(57) ABSTRACT

An electronic device includes a main body defining an opening, and a key mechanism secured in the opening. The key mechanism includes a fixing mechanism, a circuit board and a key. The fixing mechanism includes a tab and a support. The tab protrudes from a sidewall of the opening. The support includes an elastic supporting rib connected to the tab. The circuit board is fixed on the support and includes a switch. The key is rotatably connected to the fixing mechanism actuates the switch to generate an input signal. The supporting rib applies a restoring force to the key.

18 Claims, 4 Drawing Sheets

ELECTRONIC DEVICE WITH KEY MECHANISM THEREOF

BACKGROUND

1. Technical Field

The present disclosure relates to an electronic device with a key mechanism thereof.

2. Description of Related Art

Electronic devices, such as mobile phones and electronic books, include one or more keys, which allow users to conveniently adjust volume, page up and down, or pan the images, are commonly known. Usually, a key secured on the sidewall of the electronic device includes a keycap, a bracket supporting the keycap, a pivot rotatably connecting the keycap to the bracket, an elastic element, and a switch. In use, the keycap rotates about the pivot when being depressed. The pressure is transmitted to the switch by the elastic element. The touch switch is actuated and generates an input signal. The elastic element is also pushes the keycap back to its normal position. However, the restoring forces of the elastic element become weak or even lost after repeated use.

Therefore, what is needed is an electronic device with a key mechanism alleviating the limitations described above.

BRIEF DESCRIPTION OF THE DRAWINGS

The components in the drawings are not necessarily drawn to scale, the emphasis instead being placed upon clearly illustrating the principles of an electronic device with a key mechanism. Moreover, in the drawings, like reference numerals designate corresponding parts throughout the several views.

DETAILED DESCRIPTION

Figure 1:
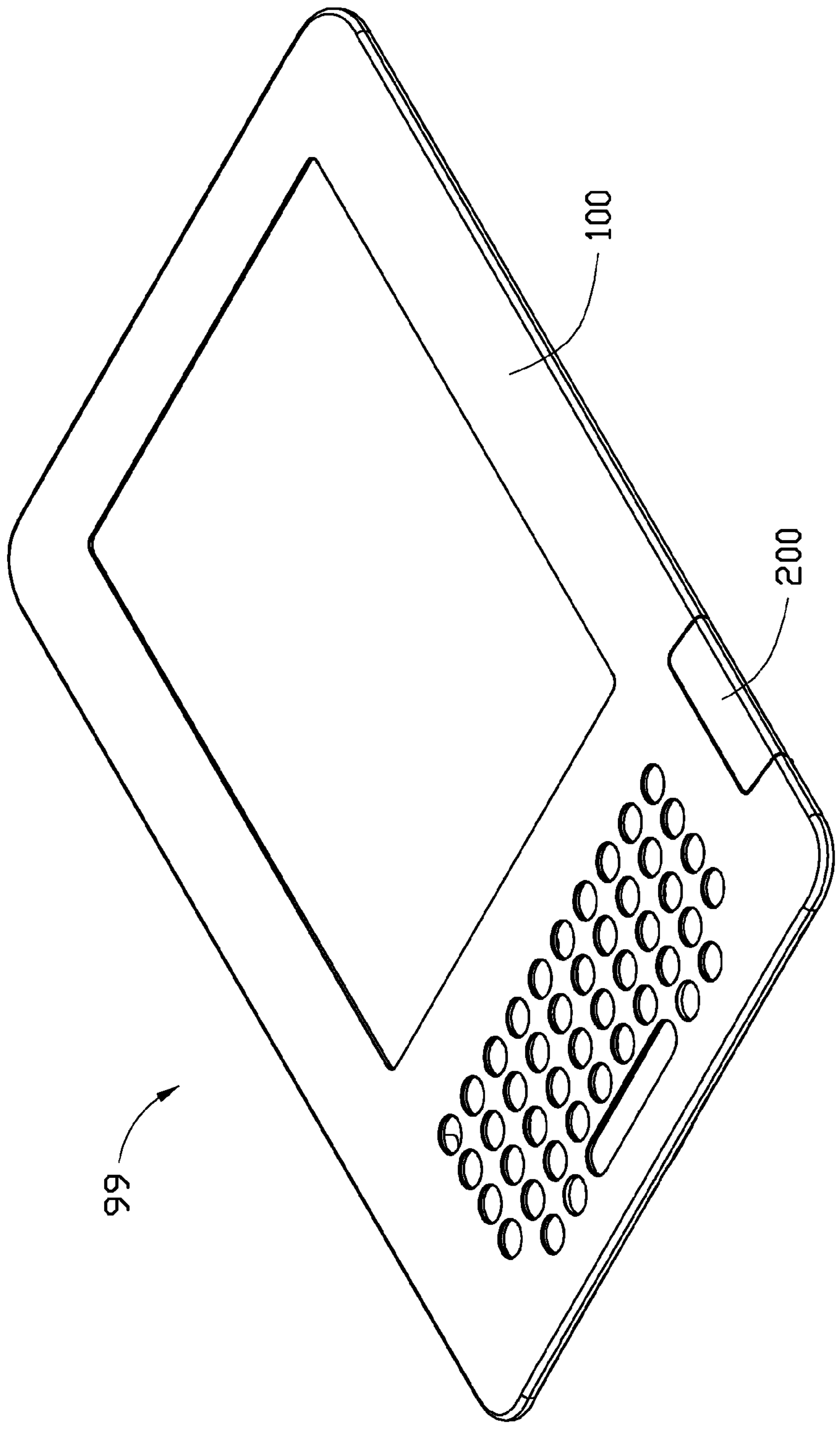
FIG. 1 is an isometric view of an exemplary embodiment of an electronic device with a key mechanism.

Referring to FIG. 1, an electronic device 99 is disclosed as an exemplary embodiment. The electronic device 99 includes a main body 100 and a key mechanism 200 secured to the main body 100. In the embodiment, the electronic device 99 can be an electronic reader. The key mechanism 200 can be used to adjust the audio volume of the electronic reader. In other embodiments, the electronic device 99 may be a mobile phone, or a music player. And, the key mechanism 200 may also perform page up and down or control the moving direction of images shown on the electronic device 99.

Figure 2:
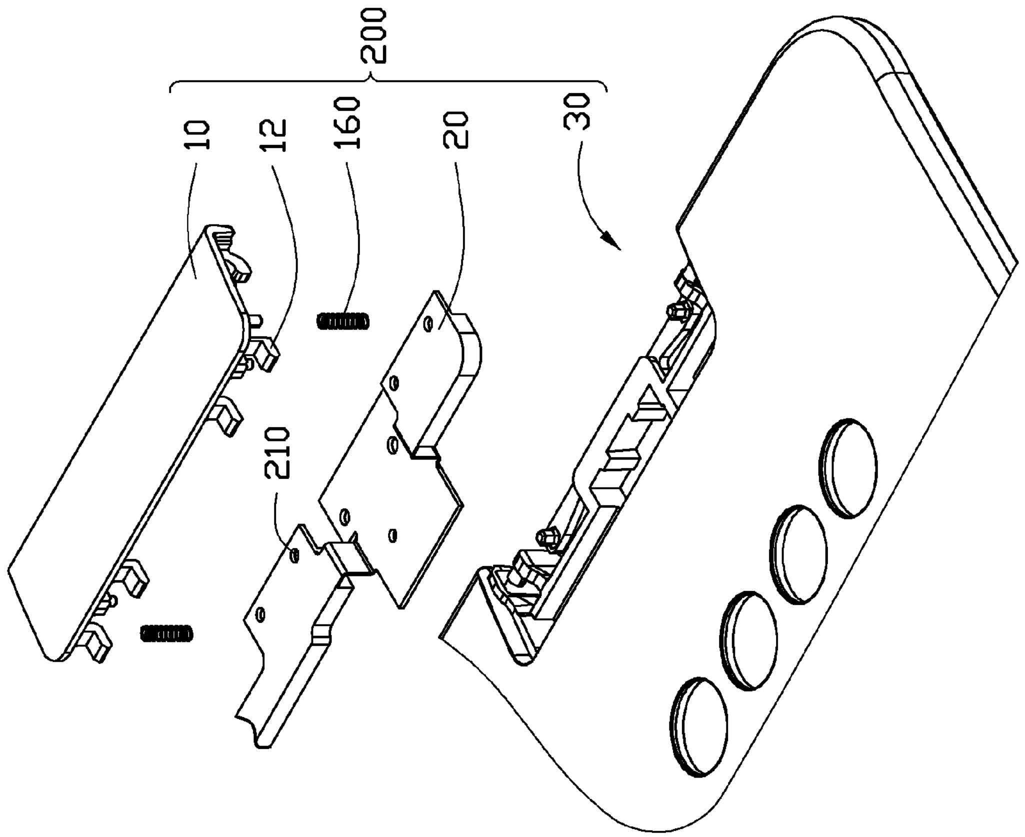
FIG. 2 is a partial, exploded view of the electronic device of FIG. 1.
Figure 3:
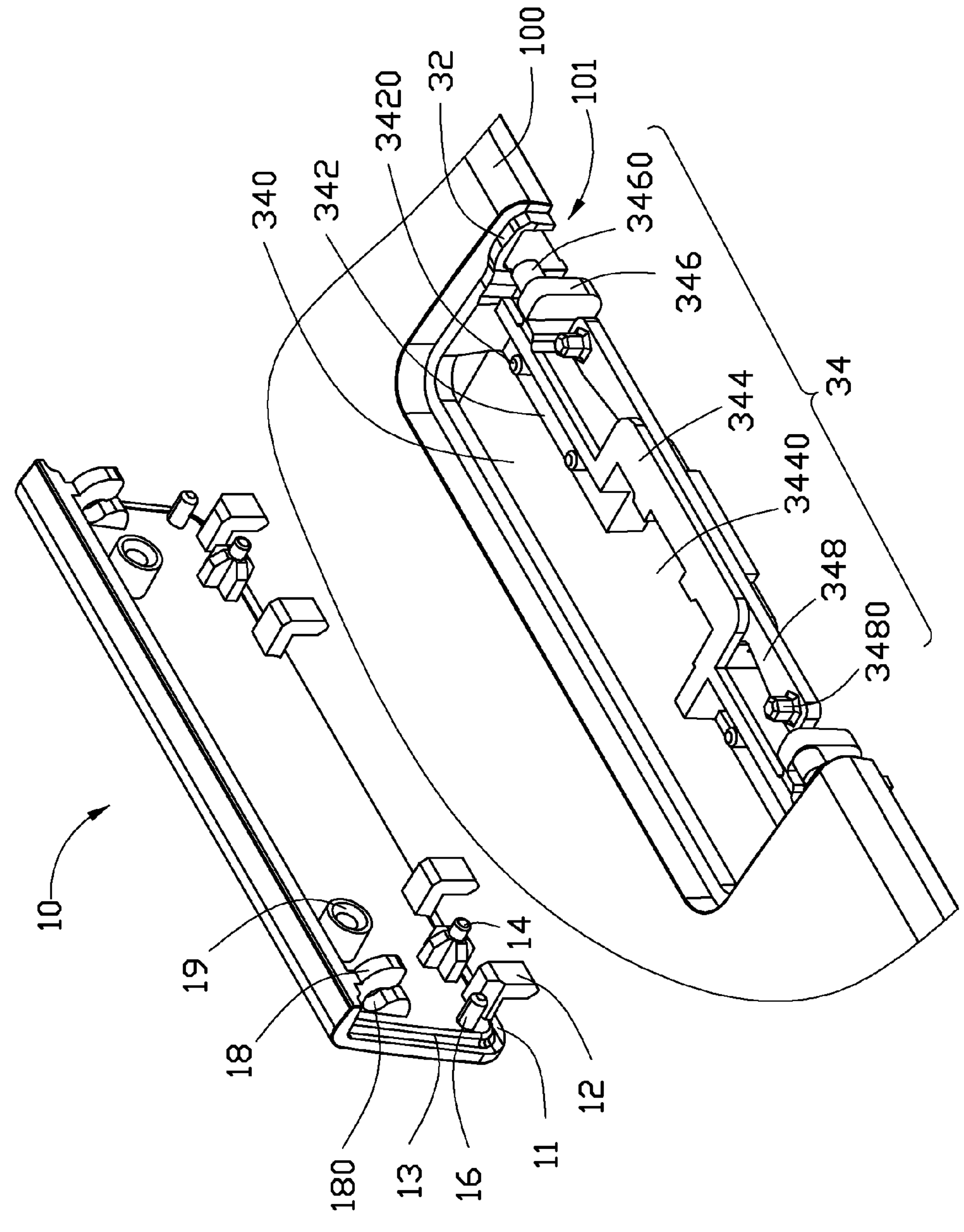
FIG. 3 is another partial, exploded view the electronic device of FIG. 1, viewed from a different aspect.

Referring to FIGS. 2 and 3, an opening 101 is defined in the main body 100. The key mechanism 200 is secured in the opening 101. The key mechanism 200 includes a key 10, a circuit board 20, and a fixing mechanism 30 secured in the main body 100. The circuit board 20 is a flexible board and defines a number of fixing holes 210.

The fixing mechanism 30 includes a tab 32 and a support 34 connected to the tab 32. A space 340 is defined between the support 34 and the tab 32. The tab 32 vertically extends along the sidewall of the opening 101, and is used for supporting the key 10. The top surface of the key 10 is substantially flush with the upper surface of the main body 100.

The support 34 supports the circuit board 20 and includes an elastic supporting rib 344. Two ends of the supporting rib 344 are connected to the tab 32, for applying a restoring force to the key 10. The support 34 defines a U-shaped opening 3440 in an inner side facing the tab 32. The support 34 also includes two cantilevered members 348 formed on its outer side. Each cantilevered member 348 includes a post 3480 formed at its free end and extending upwards.

The support 34 further includes two supporting blocks 342 formed on the inner side facing the tab 32. Two intersecting sides of the supporting block 342 are respectively connected to the tab 32 and the supporting rib 344. Each supporting block 342 includes two posts 3420 aligned with the fixing holes 210 of the circuit board 20. The support 34 further includes two fixing members 346 formed on its outer side. Each fixing member 346 includes a bolt 3460 protruding therefrom and extending horizontally.

The key 10 is elastic and the top surface of the key 10 is smooth. An inner surface of the key 10 includes a first sidewall 11 and a second sidewall 13 adjacent to and perpendicular to the first sidewall 11, on the periphery thereof. The tab 32 of the fixing mechanism 30 supports the first and second sidewalls 11, 13.

Four hooks 12, two actuating posts 14, and two retaining posts 16 protrude from the inner surface of the key 10 and are adjacent to the first sidewall 11. The four hooks 12 are divided into two pairs. The two pairs of the hooks 12 are arranged adjacent to the opposite ends of the first sidewall 11 and are hooked on an inner surface of the tab 32. In other embodiments, the number of the hooks may be two. The two actuating posts 14 and the two retaining posts 16 are respectively arranged adjacent to the opposite ends of the first sidewall 11. Each actuating post 14 is located between a pair of the hooks 12 and actuates the switch (not shown) on the circuit board 20 to generate an input signal. The retaining post 16 is located at the corner of the inner surface of the key 10 where the first and second sidewalls 11, 13 intersect.

A spring 160 is sleeved on each retaining post 16. A free end of the spring 160 resists the circuit board 20, for supporting the key 10 together with the retaining post 16 and applying a restoring force to the key 10 together with the supporting rib 344.

Two fixing elements 18 and two receiving poles 19 also protrude from the inner surface of the key 10, and are arranged at the opposite ends of the second sidewall 13. A bolt hole 180 is defined in each of the fixing elements 18. The bolt 3460 is received in the bolt hole 180 and the key 10 is rotatably connected to the fixing mechanism 30. The receiving pole 19 is configured for receiving the post 3480 of the cantilevered member 348, thus strengthening the engagement between the key 10.

Figure 4:
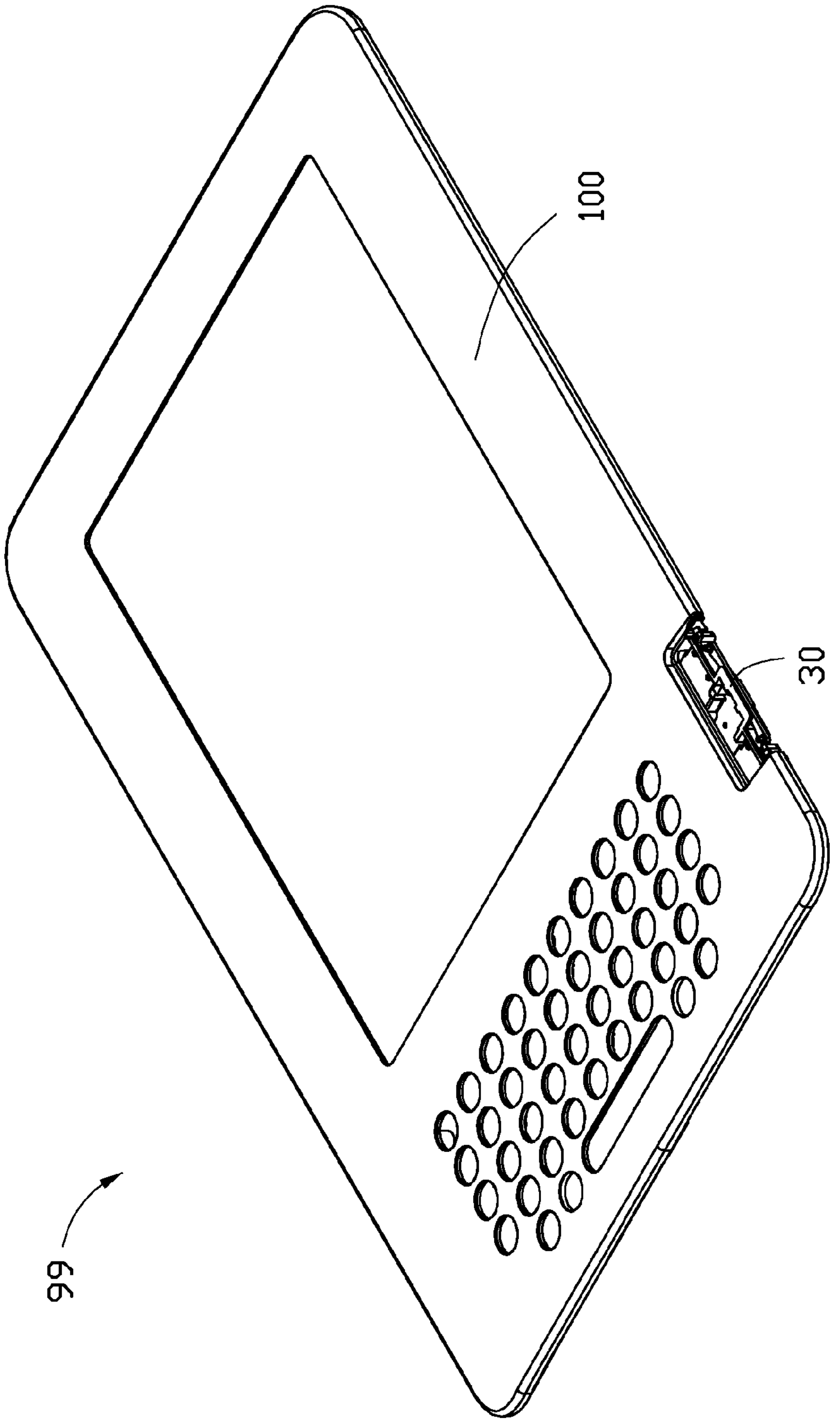
FIG. 4 is an isometric view of the electronic reader of FIG. 1, with a key of the key mechanism omitted for clarity.

In assembly, the circuit board 20 and the key 10 are connected to the fixing mechanism 30 in sequence. Specifically, referring to FIGS. 2, 3 and 4, the fixing holes 210 of the circuit board 20 are first sleeved on the posts 3420. The circuit board 20 is then arranged on the fixing mechanism 30. The hooks 12 of the key 10 penetrate from the through hole 340 to resist against the inner surface of the tab 32. The fixing elements 18 are sleeved on the bolts 3460, and the receiving poles 19 are pressed to receive the posts 3480. Finally, the key 10 is pressed until the upper surface of the key 10 is flush with the upper surface of the main body 100.

In use, one end of the key 10 can be depressed to cause the elastic deformation of the supporting rib 344. The depressed end of the key 10 rotates about the bolt 3460 of the fixing mechanism 30. The depressed end and its periphery parts of the key 10 are caused to elastically deform and recess appreciably, causing the retaining post 16, the actuating post 14 and the spring 160 to be pressed. The actuating post 14 contacts the circuit board 20 to generate an input signal. The key 10 can rotate back to its initial state by the restoring forces of the supporting rib 344 and the spring 160 when the depression on the key 10 is ceased.

In the embodiment, the two ends of the supporting rib 344 resist on the center part of the key 10. The supporting rib 344 and the spring 160 are caused to be elastically deformed when the key 10 is depressed. The supporting rib 344 and the spring 160 together support the key 10, and provide restoring forces to the key 10. The key 10 can then return to its normal position. Since the supporting rib 344 serving as an auxiliary spring elements, the service life of the spring 160 can thus be prolonged. Even when the restoring forces of the spring 160 become weak or lost after repeated use, the key 10 can still work properly due to the elastic supporting rib 344. Thus the reliability of the electronic device 99 is enhanced.

Although the present disclosure has been specifically described on the basis of the embodiments thereof, the disclosure is not to be construed as being limited thereto. Various changes or modifications may be made to the embodiments without departing from the scope and spirit of the disclosure.

What is claimed is:

1. An electronic device comprising:

a main body defining an opening; and a key mechanism secured in the opening and comprising:

a fixing mechanism comprising a tab protruding from a sidewall of the opening, and a support comprising an elastic supporting rib connected to the tab;

a circuit board fixed on the support and comprising a switch; and a key rotatably connected to the fixing mechanism, and configured for actuating the switch to generate an input signal, wherein the supporting rib is configured for applying a restoring force to the key.

2. The electronic device as described in claim 1, wherein an surface of the key comprises a first sidewall and a second sidewall adjacent to and perpendicular to the first sidewall on the periphery thereof, and the tab supports the first and second sidewalls.

3. The electronic device as described in claim 2, wherein two actuating posts protrude from opposite ends of the inner surface of the key, and are adjacent to the first sidewall and configured for actuating the switch.

4. The electronic device as described in claim 2, wherein at least two hooks protrude from opposite ends of the inner surface of the key, and are hooked on an inner surface of the tab.

5. The electronic device as described in claim 2, wherein two retaining posts protrude from opposite ends of the inner surface of the key, and one spring is sleeved on each of the two retaining posts, each of the spring is configured to apply a restoring force to the key together with the supporting rib.

6. The electronic device as described in claim 2, wherein the support further comprises two fixing members formed outer side thereon, and each fixing member comprises a bolt protruding therefrom and extending horizontally.

7. The electronic device as described in claim 6, wherein two fixing elements protrude from the inner surface of the key, and are arranged at the opposite ends of the second sidewall.

8. The electronic device as described in claim 7, wherein a bolt hole is defined in each of the fixing elements, and the bolt is received in the bolt hole.

9. The electronic device as described in claim 2, wherein the support further comprises two cantilevered members formed outer side thereon, and each cantilevered member comprises a post formed at the free end and extending upwards thereof.

10. The electronic device as described in claim 9, wherein two receiving poles protrude from the inner surface of the key, and are arranged at the opposite ends of the second sidewall, and the receiving pole is configured for receiving the post.

11. The electronic device as described in claim 2, wherein a top surface of the key is substantially flush with an upper surface of the main body.

12. The electronic device as described in claim 2, wherein the tab extends along the sidewall of the opening and a space is defined between the support and the tab.

13. The electronic device as described in claim 2, wherein the circuit board is a flexible circuit board.

14. The electronic device as described in claim 2, wherein the electronic device is an electronic reader and the key mechanism is used for adjusting audio volume of the electronic reader.

15. An electronic reader comprising:

a main body defining an opening; and a key mechanism configured for adjusting audio volume of the electronic reader, and secured in the opening, the key mechanism comprising:

a fixing mechanism comprising a tab protruding from a sidewall of the opening, and a support comprising an elastic supporting rib connected to the tab;

a circuit board fixed on the support and comprising a switch; and a key rotatably connected to the fixing mechanism, and configured for actuating the switch to generate an input signal, wherein the supporting rib is configured for applying a restoring force to the key.

16. The electronic reader as described in claim 15, wherein a top surface of the key is substantially flush with an upper surface of the main body.

17. The electronic reader as described in claim 15, wherein the tab extends along the sidewall of the opening and a space is defined between the support and the tab.

18. The electronic reader as described in claim 15, wherein the circuit board is a flexible circuit board.

* * * * *